(12) United States Patent
He

(10) Patent No.: US 6,298,077 B1
(45) Date of Patent: Oct. 2, 2001

(54) GAINASP/AIGAINP LASER DIODES WITH AlGAAS TYPE II CARRIER BLOCKING LAYER IN THE WAVEGUIDE

(75) Inventor: Xiauguang He, Tucson, AZ (US)

(73) Assignee: Opto Power Corporation, Tucson, AZ (US)

( * ) Notice: Subject to any disclaimer, the term of this patent is extended or adjusted under 35 U.S.C. 154(b) by 0 days.

(21) Appl. No.: 09/250,900

(22) Filed: Feb. 16, 1999

(51) Int. Cl.[7] .................................................. H01S 5/323
(52) U.S. Cl. ............................................................ 372/45
(58) Field of Search .................................. 372/45, 46

(56) References Cited

U.S. PATENT DOCUMENTS 5,764,668 * 6/1998 Ishizaka et al. ........................ 372/45
6,014,394 * 1/2000 Tomita ..................................... 372/45

* cited by examiner

Primary Examiner—James W. Davie
(74) Attorney, Agent, or Firm—Herbert M. Shapiro

(57) ABSTRACT

A GaInAsP/AR GaInP laser diode is provided with an AlGaAs type II carrier blocking layer in the waveguide of the diode. The resulting diode exhibits a relatively low threshold current, an increased slope efficiency and characteristic T0 and T1, for the diodes are less limited by carrier leakage.

9 Claims, 5 Drawing Sheets

US 6,298,077 B1

GAINASP/AIGAINP LASER DIODES WITH AIGAAS TYPE II CARRIER BLOCKING LAYER IN THE WAVEGUIDE

FIELD OF THE INVENTION

This invention relates to laser diodes or diode arrays and more particular to laser diodes or diode arrays which use a type II electron barrier for improved performance.

BACKGROUND OF THE INVENTION

A type II heterostructure is defined as a structure that has one (either conduction band or valence band) band offset value equal or lower than zero while the other band offset value is larger than zero. FIG. 1 shows the schematic diagram of the type II heterostructure band lineup in comparison with type I heterostructure. For the type II structure shown in FIG. 1, valence band offset $E_{vII,I}$ is less than zero while conduction band offset $E_{cII,I}$ is larger than zero, therefore it is type II heterostructure. In another case, when $E_{cII,I}$ is less than zero while $E_{vII,I}$ is larger than zero, it is type II heterostructure as well.

For a conventional laser diode structure, where either an AlGaAs/GaAs material system or an AlGaInP/GaInAs /GaAs system is used, no type II heterostructure exists. However, in a conventional laser diode structure where both AlGaAs and AlGaInP/GaInAsP are used in a laser structure simultaneously, a type II heterostructure will exist.

Prior art laser diodes use only one single material system where the deposited layers, which define the laser, are of the same material system and the layers include the various compositions of the elements which adjusts the energy gap profile of the layers as is well under stood. Thus the familiar material systems include, for example, GaAs/AlGaAs, GaInAs/GaInP and GaInAsP/AlGaInP.

AlGaAs has been used in cladding layers as a carrier blocking layer for AlGaInAsP laser diodes (L. Mawst and D, Botez "High Power InGaAsP/InGaAlP/GaAs semiconductor diode lasers, SPIE Vol 3001, 1997, P7–P12). However, in that case, the benefit of type II band offset is not used. In other words, a higher band gap AlGaInP layer can easily fulfill the blocking function.

A carrier blocking layer is highly desirable for AlGaInP/ GaInAsP laser diodes due to the intrinsic small conduction band offset of that system where a typical conduction band offset is about 30–4% of the band gap difference. Because of the small conduction band offset, electrons in the quantum wells will easily overflow to and reside in the waveguide region, and at high,h injection current, even overflow into the P-cladding region of the diode. As a result, threshold current increases, slop efficiency decreases and T0 and T1 are limited by carrier leakage.

Carrier blocking layers of a type I heterostructure can be and have been used in the waveguide region to achieve a carrier blocking function (U.S. Pat. No. 5,764,668). However, the carrier blocking layer has to be doped (e.g. $1 \times 10^{18} cm^{-3}$) for type I heterostructure, otherwise injected carriers are blocked as well. The doping in the waveguide causes absorption of light and results in an undesirable loss of light. Although a thin blocking layer can be used (injected carriers tunnel through) without doping the layer, the overflow carriers can tunnel through the barrier as well and weaken the function of the blocking layer.

A carrier blocking layer of any type (I or II) also can be used in a cladding layer. There are no significant advantages of any type as long as the blocking barrier is high enough, because the material in the cladding layer is doped anyway. The disadvantage of the carrier blocking layer in the cladding layer is that it does not stop the carrier overflow into the waveguide region.

BRIEF DESCRIPTION OF THE INVENTION

In accordance with the principles of this invention, AlGaAs with the appropriate composition is included in a waveguide adjacent to a p-cladding layer to block the leakage of injected electrons. The waveguide material comprises either GaInAs or AlGaInP (and only one of these two materials on GaAs substrates). The quantum well comprises $In_xGa_{1-x}As(0<=x<0.4)_2$ for the lasing wavelength of 870 nm to 1200 m or GaInAsP (strained or lattice matched to GaAs) for the lasing wavelength of 700 nm to 870 nm.

DETAILED DESCRIPTION OF ILLUSTRATIVE EMBODIMENTS OF THIS INVENTION

Figure 1:
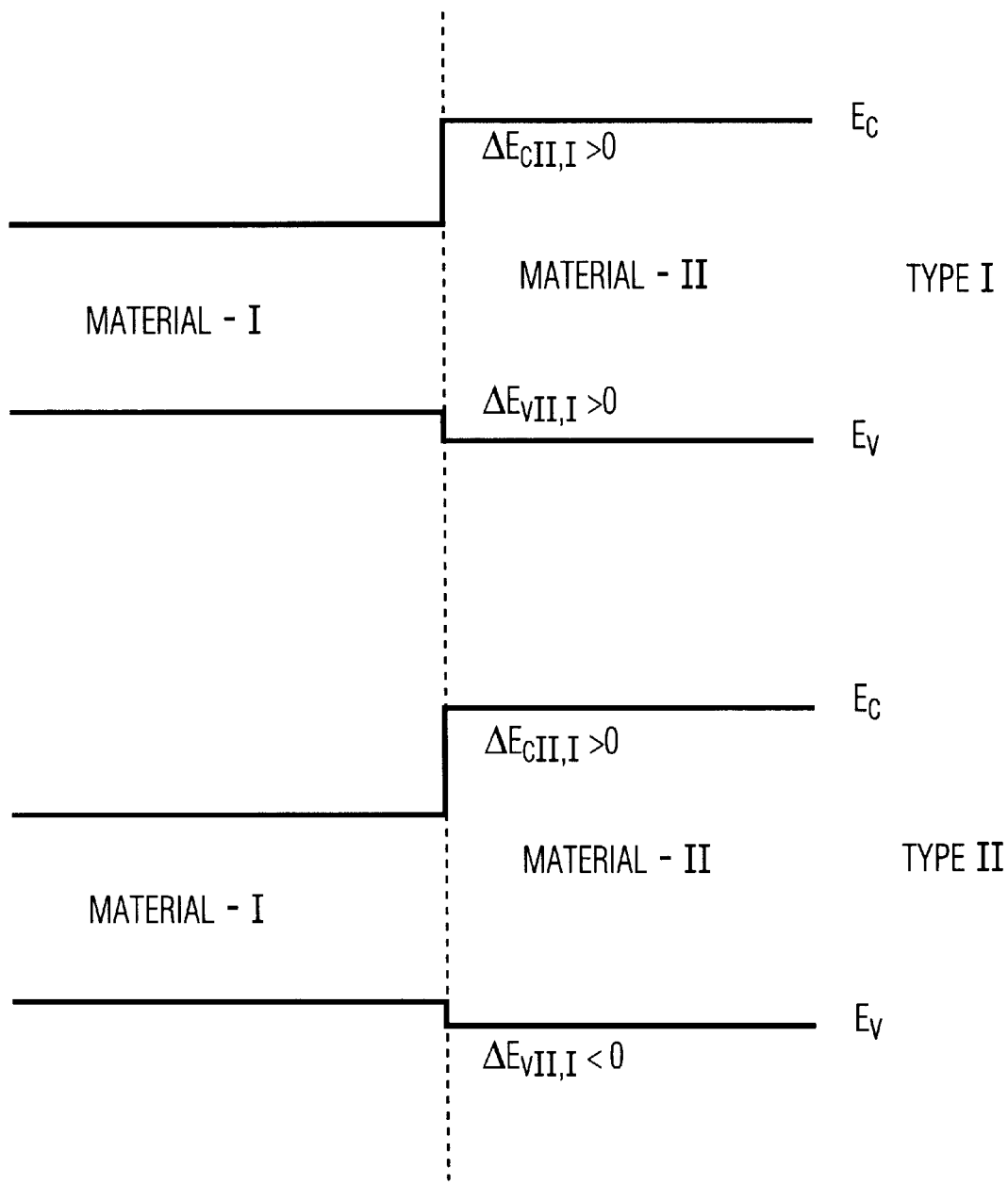
FIG. 1 is schematic diagram of the type I and type II heterostructure band lineup.

FIG. 1 shows the band lineup of the type I and type II heterostructure. Electrons reside in the conduction band ($E_c$) while holes reside in the valence band ($E_v$). The vertical height of the conduction band represents the potential of electrons. The higher the band position, the higher the potential of electrons. For the valence band, it is just the opposite, i.e., the higher of the band position, the lower the potential of holes. Carriers (electrons and holes) stay in low potential until extra energy is provided to go to a higher potential position. For a type I heterostructure, both holes and electrons tend to stay in Material-I at equilibrium. For type II heterostructure, shown in FIG. 1, electrons will be in Material-I while holes will be in Material-II.

Figure 2:
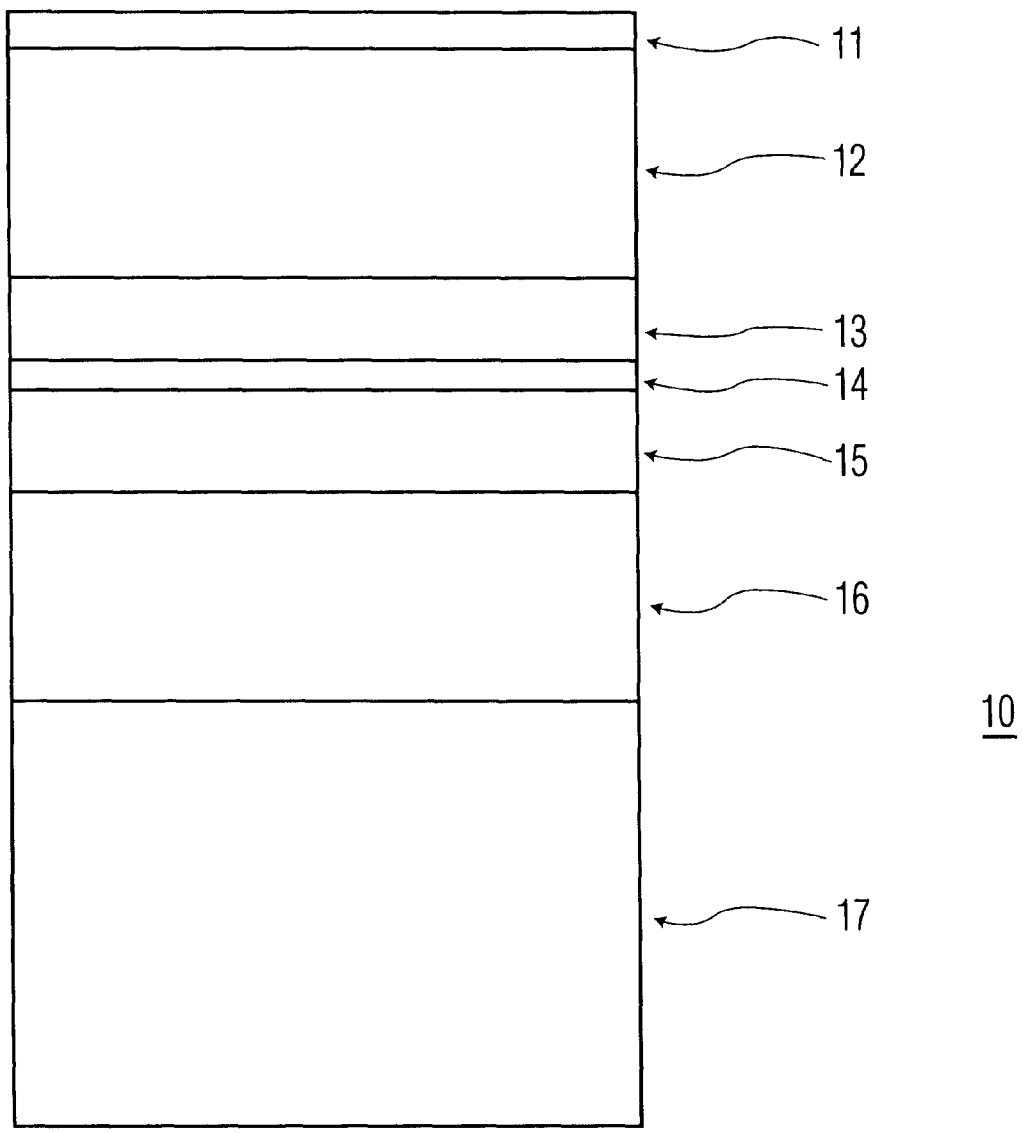
FIG. 2 is a schematic representation of a typical AlGaInP/ GaInP/GaInAsP laser diode structure.

FIG. 2 shows a schematic representation of a typical AlGaInP/GaInP/GaInAs laser diode structure 10. Layer 11 is the contact layer, which is usually formed by a highly p-type doped ($>1 \times 10^{19} cm^{-3}$) GaAs. Layer 12 is a p-type cladding layer, which is AlGaInP lattice matched to GaAs doped as p-type in the doping concentration of $1 \times 10^{17}$ to $2 \times 10^{18} cm^{-3}$. Layer 13 and layer 15 are waveguide layers, which are undoped GaInP lattice matched to GaAs. Layer 14 is the active layer which is comprised of single or multiple quantum wells. The quantum well is made of strain or non-strained GaInAs. Layer 16 is an n-type cladding layer, which is AlGaInP lattice matched to GaAs doped as n-type in the doping concentration of $1 \times 10^{17}$ to $2 \times 10^{18} cm^{-3}$. Layer 17 is the n-type GaAs substrate (carrier concentration about $2 \times 10^{18} cm^{-3}$).

Figure 3:
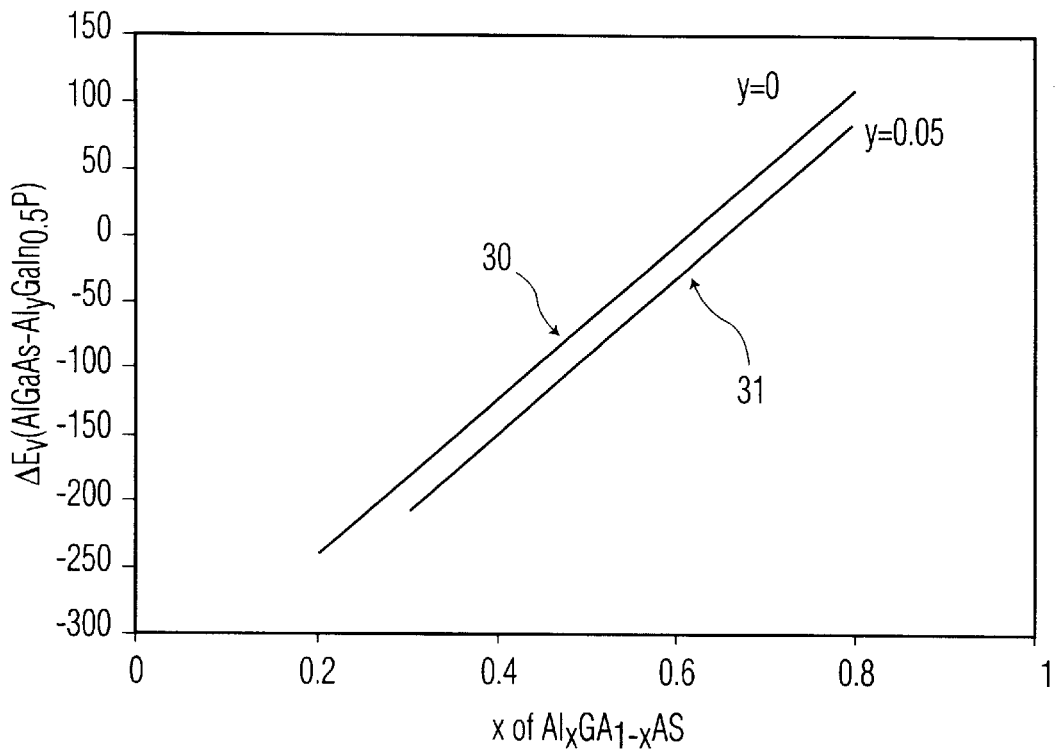
FIG. 3 is the valence band offset of AlGaAs/AlGaInP calculated according to paper (M. P. C. Krijn, Semicond. Sci & Tech., 1991, p27–31).

FIG. 3 shows the valence band offset of AlGaAs/AlGaInP calculated according to paper (M. P. C. Krijn, Semicond. Sci & Tech., 1991, p27–31). The two curves, 30 and 31, shown in FIG. 3 are the valence band offsets between AlGaAs and AlGaInP lattice matched to GaAs at Al with compositions of 0 and 0.05, respectively. Although the calculation is based on the comparison of the absolute band center position which may not match the real value exactly, accepting the assumption that AlGaAs over GaAs has a conduction band offset ratio of 0.6 while AlGaInP or GaInAs over GaAs has a conduction band offset ratio of 0.4, there will definitely be some composition of Al for AlGaAs where type-II band alignment for AlGaAs over AlGaInP or GaInAs exists. AlGaInP, lattice matched to GaAs, is usually used as waveguide for laser diodes lasing at wavelength of 700 nm to 870 nm.

Figure 4:
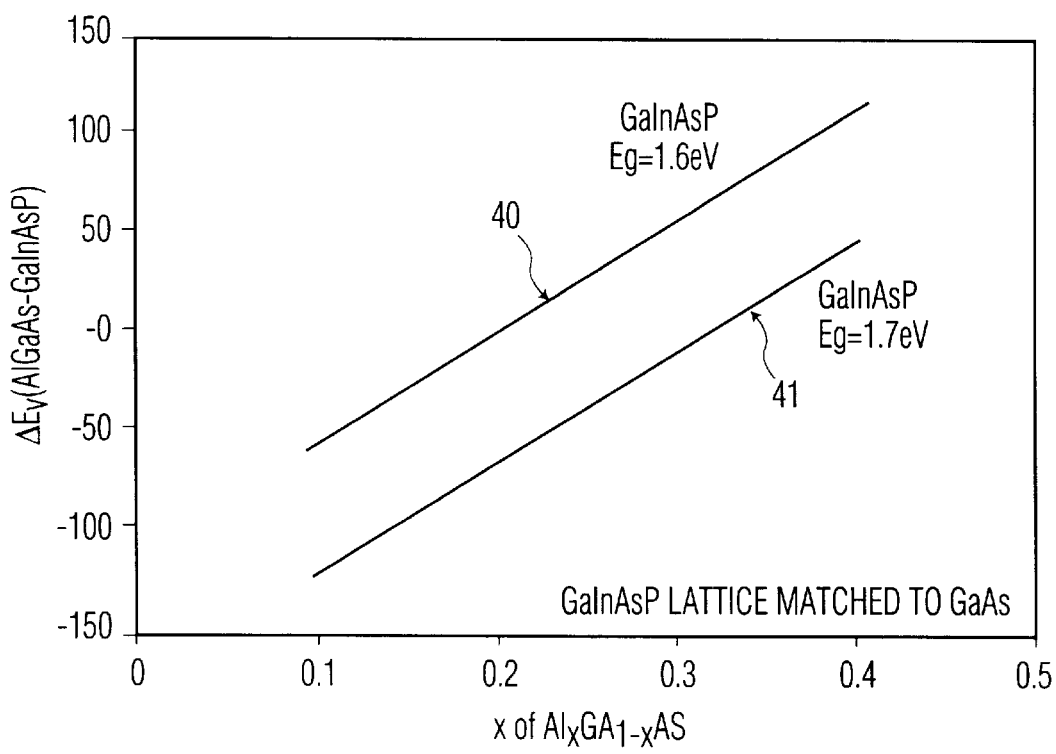
FIG. 4 is the valence band offset of AlGaAs/GaInAsP calculated according to paper (M. P. C. Krijn, Semicond. Sci & Tech., 1991, p27–31).

Similar calculations are done for the valence band offset of AlGaAs over GaInAs lattice matched to GaAs. The two curves, 40 and 41, shown in FIG. 4 are the valence band offset between AlGaAs and GaInAs at bandgap 1.6eV and 1.7eV respectively. GaInAs lattice match to GaAs is usually used as waveguide for laser diodes lasing at wavelength of 870 nm to 1200 nm.

Figure 5:
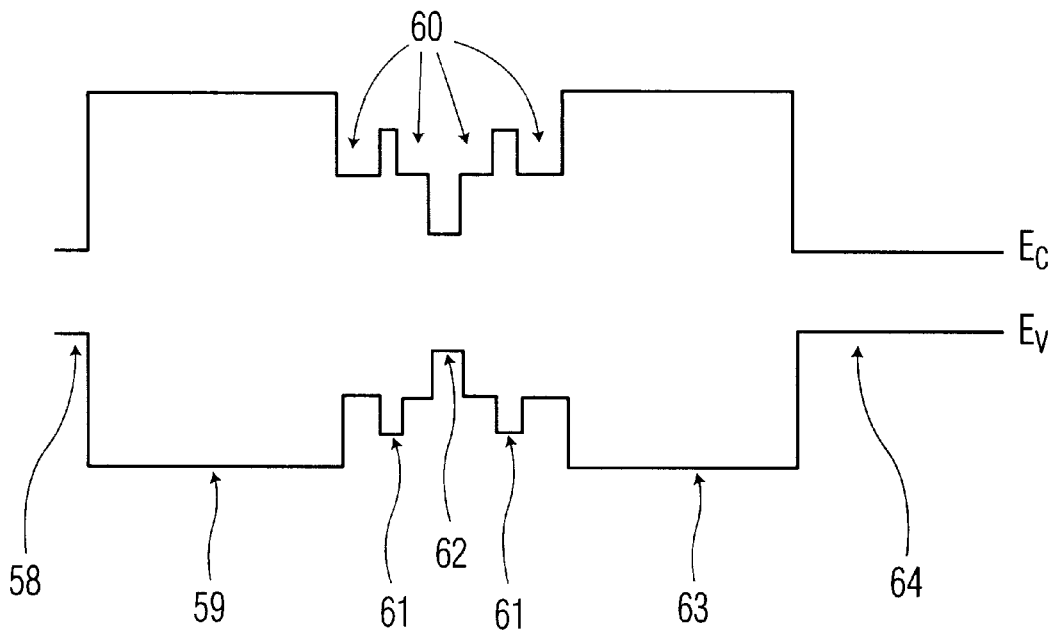
FIG. 5 is a schematic graphical representation band line up of a laser diode with a type I current blocking layer in the waveguide, prior art laser diode.

FIG. 5 shows a schematic representation of a typical laser diode structure with a type I carrier blocking layer. Layer 58 is a contact layer, which is usually formed by a highly p-type doped ($>1\times10^{19}\text{cm}^{-3}$) GaAs. Layer 59 is a p-type cladding layer, which can be AlGaInP lattice matched to GaAs doped as p-type in the doping concentration of $1\times10^{17}$ to $2\times10^{18}\text{cm}^{-3}$. Layer 60 is a waveguide layer, which can be undoped GaInP or GaInAs lattice matched to GaAs. Layer 61 is a type I carrier blocking layer, say, made of AlGaInP lattice matched to GaAs. Layer 62 is the active layer which comprises a single or multiple quantum wells. The quantum well is made of strain or non-strained, say, GaInAs. Layer 63 is an n-type cladding layer, which can be AlGaInP lattice matched to GaAs doped as n-type in the doping and layer 64 is a GaAs substrate. If layer 61 is undoped, holes will be trapped in the waveguide region between layer 59 and 61 in the p-side while electrons will be trapped in the wavelguide region between layer 61 in the n side and layer 63. The laser may not even lase. The prior art approach (of FIG. 5) is to dope layer 61 so that the injection of carriers into the layer 62 active region can be achieved. However, in this case, laser performance is poorer due to the absorption of light at the doped carrier blocking layer and partial trapping of carriers in the pocket of the waveguide adjacent to the cladding layers.

Figure 6:
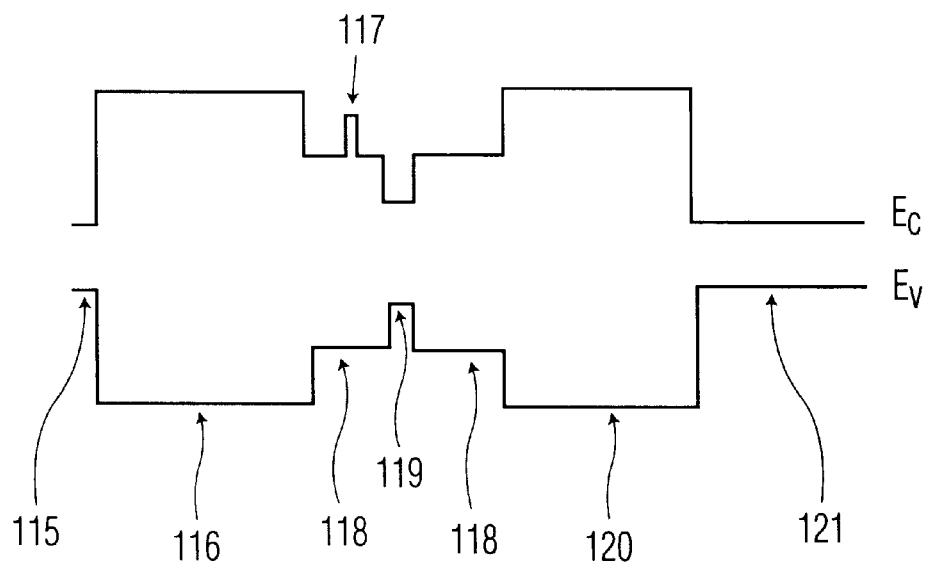
FIG. 6 is a schematic graphical representation band line up of a laser diode with a type II current blocking layer in the waveguide.

FIG. 6 shows the one embodiment of the invention. It shows a schematic representation of a laser diode structure with a type II carrier blocking layer. Layer 115 is the contact layer, which is usually formed by a highly p-type doped ($>1\times10^{19}\text{cm}^{-3}$) GaAs. Layer 116 is a p-type cladding layer, which can be AlGaInP lattice matched to GaAs or AlGaAs doped as p-type in the doping concentration of $1\times10^{17}$ to $2\times10^{18}\text{cm}^{-3}$. Layer 118 is a waveguide layer, which is undoped AlGaInP or GaInAs lattice matched to GaAs. Layer 117 is type II carrier blocking layer of, for example, AlGaAs lattice matched to GaAs. Layer 119 is the active layer which comprises a single or multiple quantum wells. The quantum well is made of strained or non-strained GaInAsP. Layer 120 is an n-type cladding layer, which can be AlGaInP lattice matched to GaAs or AlGaAs doped as n-type in the doping and layer 121 is GaAs substrate. In comparison with the case represented in FIG. 5, there is no hole pocket at the waveguide adjacent to p-type cladding layer, therefore, there is no trapping of holes in the valence band. The electrons are injected into the active layer 119 from the n-side waveguide without experiencing a barrier. The overflow electrons are stopped by layer 117 in conduction band.

Figure 7:
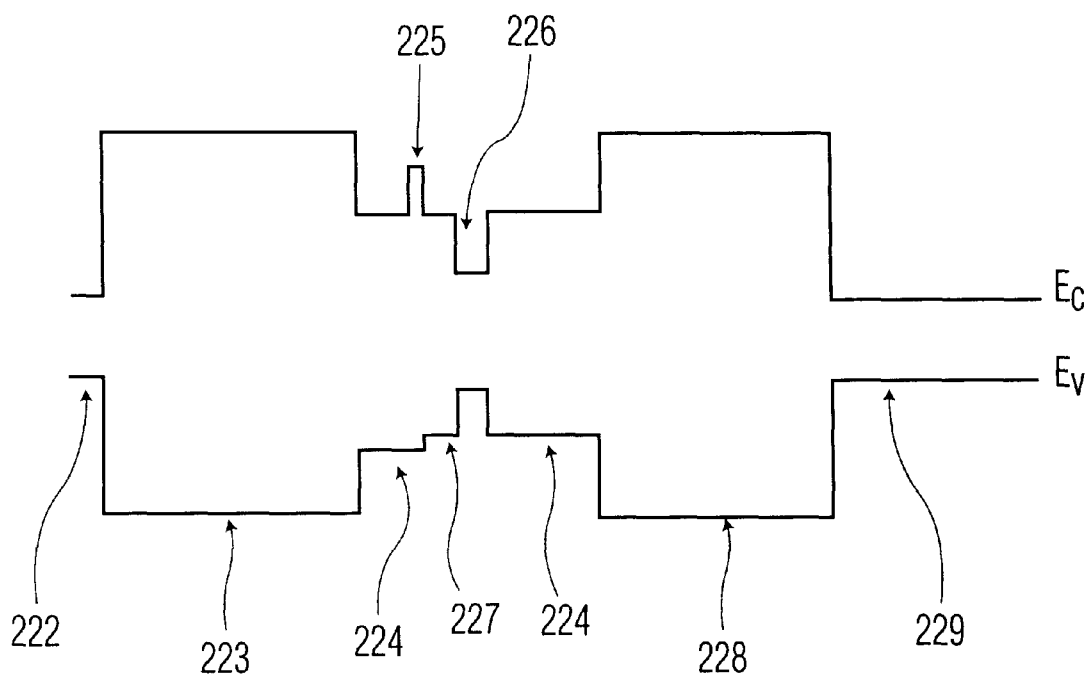
FIG. 7 is the second schematic graphical representation band line up of a laser diode with a type II current blocking layer in the waveguide.

FIG. 7 shows another embodiment of the invention. It shows schematic representation of another laser diode structure with type II carrier blocking layer. Layer 222 is the contact layer, which is usually formed by a highly p-type doped ($>1\times10^{19}\text{cm}^{-3}$) GaAs. Layer 223 is a p-type cladding layer, which can be AlGaInP lattice matched to GaAs or AlGaAs doped as p-type in the doping concentration of $1\times10^{17}$ to $2\times10^{18}\text{cm}^{-3}$. Layer 224 is a waveguide layer, which will be undoped AlGaInP or GaInAs lattice matched to GaAs. Layer 225 is a type II carrier blocking layer made, for example, of AlGaAs. Layer 226 is the active layer which comprises single or multiple quantum wells. The quantum well is made of strain or non-strained, say, GaInAs. Layer 228 is n-type cladding layer, which can be AlGaInP lattice matched to GaAs or AlGaAs doped as n-type in the doping and layer 229 is GaAs substrate. The embodiment of FIG. 7 distinguishes over the embodiment in FIG. 6 by the inclusion of layer 227, which is part of the waveguide, but with higher valence band energy. The advantage of layer 227 is that it builds in tolerance to the composition of carrier blocking layer 225. Without layer 227, the composition of layer 225 needs to be almost exactly right. Too high Al composition causes a hole injection barrier; too low Al composition causes hole traps. The thickness of layer 227 can be 0, in which case, the composition of layer 225 reaches maximum flexibility.

What is claimed is:

1. A GaInAsP/AlGaInP laser diode, said diode including a GaAs substrate, said diode also including adjacent to said substrate a waveguide layer sandwiched between first and second cladding layers, said waveguide layers, including an active layer and an AlGaAs Type II carrier blocking layer.

2. A laser diode as in claim 1 wherein said waveguide layer comprises GaInAsP.

3. A laser diode as in claim 1 wherein said waveguide layer comprises AlGaInP.

4. A laser diode as in claim 3, said diode including a quantum well, said quantum well comprising $In_xGa_{1-x}As$ ($0<=x<0.4$).

5. A laser diode as in claim 2, said diode including a quantum well, said quantum well comprising GaInAsP lattice matched to GaAs.

6. A laser diode as in claim 2, said diode including a quantum well, said quantum well comprising strained GaInAsP to match GaAs.

7. A laser diode as in claim 3, said diode including a quantum well, said quantum well comprising $In_xGa_{1-x}As$ ($0<=x<0.4$).

8. A laser diode as in claim 3, said diode including a quantum well, said quantum well comprising GaInAsP lattice matched to GaAs.

9. A laser diode as in claim 3, said diode including a quantum well, said quantum well comprising strained GaInAsP to match GaAs.

* * * * *